(12) United States Patent
Ho et al.

(10) Patent No.: US 10,236,294 B2
(45) Date of Patent: Mar. 19, 2019

(54) METHOD OF MANUFACTURING A SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chien-Ting Ho, Taichung (TW); Shih-Fang Tzou, Tainan (TW); Chun-Yuan Wu, Yun-Lin County (TW); Li-Wei Feng, Kaohsiung (TW); Yu-Chieh Lin, Kaohsiung (TW); Ying-Chiao Wang, Changhua County (TW); Tsung-Ying Tsai, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/854,827

(22) Filed: Dec. 27, 2017

(65) Prior Publication Data
US 2018/0190656 A1 Jul. 5, 2018

(30) Foreign Application Priority Data
Dec. 29, 2016 (CN) .......................... 2016 1 1242446

(51) Int. Cl.
*H01L 27/105* (2006.01)
*H01L 21/768* (2006.01)
(Continued)

(52) U.S. Cl.
CPC .... *H01L 27/1052* (2013.01); *H01L 21/02532* (2013.01); *H01L 21/31111* (2013.01); *H01L 21/76834* (2013.01); *H01L 21/76846* (2013.01); *H01L 21/76879* (2013.01); *H01L 21/76895* (2013.01); *H01L 21/76897* (2013.01);
(Continued)

(58) Field of Classification Search
CPC ........... H01L 27/1052; H01L 21/31111; H01L 21/02532; H01L 29/6656; H01L 21/76846; H01L 21/76895; H01L 29/6653; H01L 21/76897; H01L 21/76834; H01L 21/76879
See application file for complete search history.

(56) References Cited

U.S. PATENT DOCUMENTS 9,214,382 B2 12/2015 Lee
9,257,437 B2 2/2016 Park
(Continued)

*Primary Examiner* — Asok K Sarkar
(74) *Attorney, Agent, or Firm* — Winston Hwu

(57) ABSTRACT

The present invention proposes a method of manufacturing a semiconductor device, which includes the steps of providing a substrate with a memory region and a logic region, forming bit lines and logic gates respectively in the memory region and the logic region, wherein storage node regions are defined between bit lines, forming a first low-K dielectric layer on sidewalls of bit lines, forming a doped silicon layer in the storage node regions between bit lines, wherein the top surface of doped silicon layer is lower than the top surface of bit line, forming a second low-K dielectric layer on sidewalls of storage node regions, and filling up storage node regions with metal plugs.

10 Claims, 6 Drawing Sheets

(51) Int. Cl.
*H01L 21/02* (2006.01)
*H01L 29/66* (2006.01)
*H01L 21/311* (2006.01)
*H01L 21/3105* (2006.01)

(52) U.S. Cl.
CPC ...... *H01L 29/6653* (2013.01); *H01L 29/6656* (2013.01); *H01L 21/31053* (2013.01)

(56) References Cited

U.S. PATENT DOCUMENTS

| | | |
|---|---|---|
| 9,293,362 B2 | 3/2016 | Lee |
| 9,379,002 B2 | 6/2016 | Han |
| 9,418,998 B2 | 8/2016 | Kim |
| 9,425,200 B2 | 8/2016 | Hwang |
| 2005/0280000 A1* | 12/2005 | Ishii ................ G11C 11/405 257/67 |
| 2014/0187037 A1 | 7/2014 | Rho |
| 2015/0333069 A1* | 11/2015 | Kim ................ H01L 27/10814 257/334 |
| 2015/0333071 A1* | 11/2015 | Kim ................ H01L 27/10855 438/510 |
| 2016/0027727 A1 | 1/2016 | Kim |
| 2016/0035676 A1* | 2/2016 | Im ................ H01L 27/10855 257/306 |
| 2016/0093717 A1* | 3/2016 | Oh ................ H01L 29/4236 438/270 |
| 2016/0172363 A1* | 6/2016 | Doebler ........... H01L 21/31144 257/296 |
| 2016/0211215 A1 | 7/2016 | Lee |
| 2016/0300763 A1* | 10/2016 | Kim ................ H01L 21/76895 |

\* cited by examiner

METHOD OF MANUFACTURING A SEMICONDUCTOR DEVICE

BACKGROUND OF THE INVENTION

1. Field of the Invention

The present invention relates generally to a method of manufacturing a semiconductor device, more specifically, to a method of manufacturing a semiconductor device using low-K materials.

2. Description of the Prior Art

Semiconductor devices are widely used in an electronic industry because of their small size, multi-function and/or low manufacture costs. Semiconductor devices are categorized as semiconductor devices storing logic data, semiconductor logic devices processing operations of logical data, hybrid semiconductor devices having both the function of semiconductor memory devices and the function of semiconductor logic devices and/or other semiconductor devices.

Semiconductor devices may generally include vertically stacked patterns and contact plugs electrically connecting the stacked patterns to each other. As semiconductor devices have been highly integrated, a space between the patterns and/or a space between the pattern and the contact plug have been reduced. Thus, a parasitic capacitance between the patterns and/or between the pattern and the contact plug may be increased. The parasitic capacitance may cause performance deterioration (e.g., reduction of an operating speed) of semiconductor devices. For this reason, how to reduce parasitic capacitance in semiconductor devices is an urgent task to research and develop in the semiconductor industry.

SUMMARY OF THE INVENTION

The purpose of the present invention is to provide a method of manufacturing a semiconductor device. The method features the low-K dielectric layer disposed along two sides of bit lines and surrounding storage nodes to effectively reduce the parasite capacitance in devices, and the process steps of the present invention may be integrated with the process steps of logic devices in peripheral regions without additional process cost or time.

To achieve the above-mentioned purpose, a method of manufacturing a semiconductor device is provided in one embodiment of the present invention. The steps of the method include providing a substrate with a memory region and a logic region thereon, forming bit lines and logic gates respectively in the memory region and the logic region, wherein storage node regions are defined between bit lines, forming a first low-K dielectric layer on sidewalls of bit lines, forming doped-silicon layer in each storage node region between bit lines, wherein the top surface of doped-silicon layer is lower than the top surface of bit lines, forming a second low-K dielectric layer on sidewalls of the storage node regions, and filling up the storage node regions in the memory region with metal plugs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
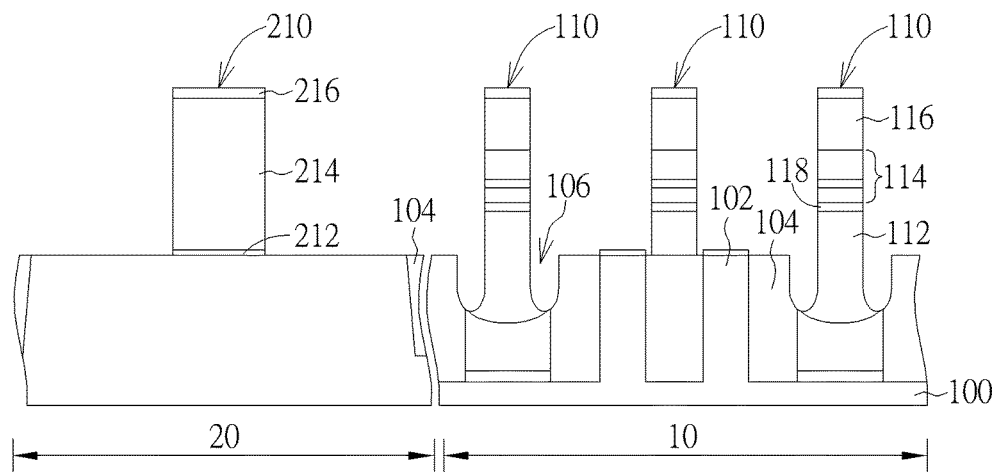
FIGS. 1-11 are cross-sectional views schematically showing the process flow of manufacturing a semiconductor device in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

The terminology used herein to describe embodiments of the inventive concepts is not intended to limit the scope of the inventive concepts. The use of the singular form in the present document should not preclude the presence of more than one referent. In other words, elements of the inventive concepts referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

The process flow of manufacturing a semiconductor device of the present invention will be described hereinafter with reference to FIG. 1 to FIG. 11 in sequence. Please refer to FIG. 1. According the method of manufacturing a semiconductor device in the present invention, a semiconductor substrate 100 is first prepared to serve as the base for components to be disposed thereon. The semiconductor substrate may include silicon substrate, silicon-germanium (SiGe) substrate, or silicon-on-insulator (SOI) substrate, etc, wherein a memory region 10 is defined thereon for disposing memory arrays consisting of multiple memory cells, and a logic region 20 is defined thereon surrounding the memory region 10 for disposing other logic or functional circuits, such as sense amplifier, address buffer, and address decoder, etc. Some process steps described in following embodiments are only performed in one of the memory region 10 and the logic region 20, while others may be performed in both regions.

The semiconductor substrate 100 includes active regions 102 and field oxide regions 104 (or shallow trench isolations, STI). Field oxide region 104 may be formed by filling up the preformed field oxide trenches with field insulating material, such as silicon oxide. The active regions 102 are defined by the surrounding field oxide region 104. The memory region 10 and logic region 20 of the semiconductor substrate 100 are pre-formed respectively with bit lines 110 and logic gates 210 thereon, wherein the bit line 110 may include from bottom to top a bit line contact plug 112 (ex. a doped poly-silicon layer or an amorphous silicon layer extending into the semiconductor substrate 100 and connecting the active region thereunder), a bit line electrode 114 (ex. Ti/TiN/W multilayer metal structure), and a hard mask 116 (ex. a silicon nitride layer). A metal silicide layer 118 may be further formed between bit line contact plug 112 and bit line electrode 114, for example, by the reaction of lowest portions of bit line electrode with the silicon surface, to connecting the bit line electrode 114 and the bit line contact plug 112. In the manufacturing process, trenches 106 may be formed between two sides of bit line gate 110 and substrate since the width of opening of bit line contact formed in previous etch process is larger than the width of bit line 110 itself.

Refer again to FIG. 1. The logic gate 210 on the logic region 20 of semiconductor substrate 100 may include a gate dielectric layer 212 (ex. a silicon oxide layer), a gate electrode layer 214 (ex. a poly-silicon layer), and a capping layer 216 (ex. a silicon nitride layer). In the embodiment of present invention, the logic gate 210 on the logic region 20 and the bit line gate 110 on the memory region 10 are formed in different processes. However, in other embodiment, the logic gate 210 on the logic region 20 and the bit line gate 110 on the memory region 10 may be formed in the same process.

Figure 2:
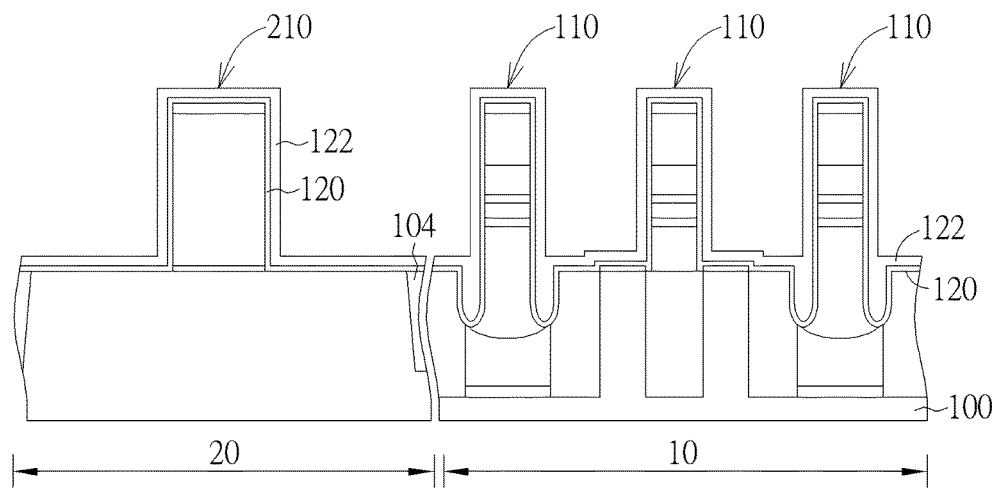

Please refer to FIG. 2. After bit lines 110 and logic gates 210 are formed, a first spacer layer 120 and a second spacer layer 122 are conformally formed on the memory region 10 and logic region 20 and completely cover thereon, wherein the first spacer layer 120 may be a silicon nitride layer or a silicon carbon nitride layer plus an oxide layer to function as a barrier layer for bit lines. The second spacer layer 120 may be another silicon nitride layer with distinctive etch selectivity compared to the oxide layer of first spacer layer 120. The first spacer layer 120 and the second spacer layer 122 would fill up the trenches 106 at both sides of the bit line 110. Alternatively, in some embodiment, the trench 106 is not filled up on purpose to form gap inside.

Figure 3:
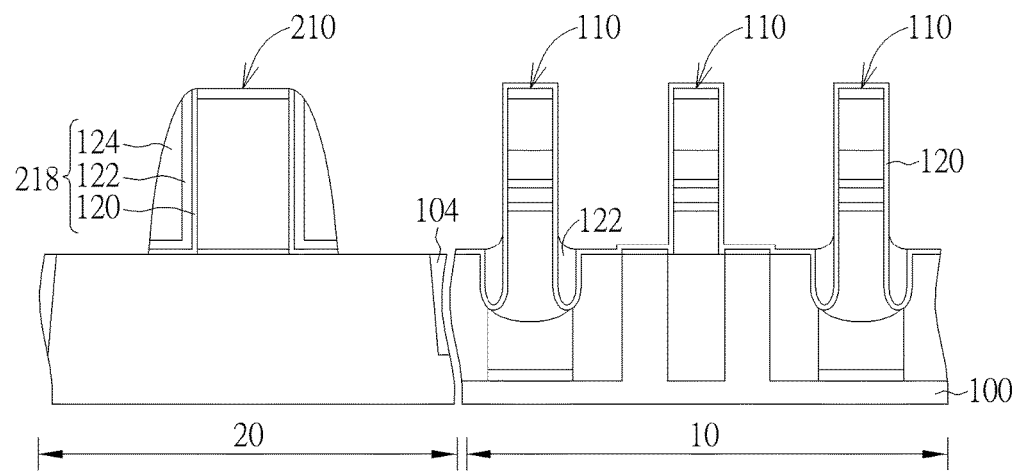

Please refer to FIG. 3. After the first spacer layer 120 and second spacer layer 122 are formed, a third spacer material are formed in the logic region 20 and then are performed with an anisotropic etch process to form spacers 218 at both sides of the logic gates 210, wherein the spacer 218 is made up of the first spacer layer 120, the second spacer layer 122 and the third spacer layer 124. Please note that there is no third spacer layer 124 remaining in the memory region 10 in this stage. The third spacer layer 124 may be selectively removed from memory region 10 by using photoresist and buffered oxide etch (BOX) process. Furthermore, the portion of second spacer layer 122 not covered by the third spacer layer 124 on the memory region 10 is then removed by using other etchants with appropriate etch selectivity. Thus, only the portion of second spacer layer 122 inside the trenches may remain and the first spacer layer 120 is exposed.

Figure 4:
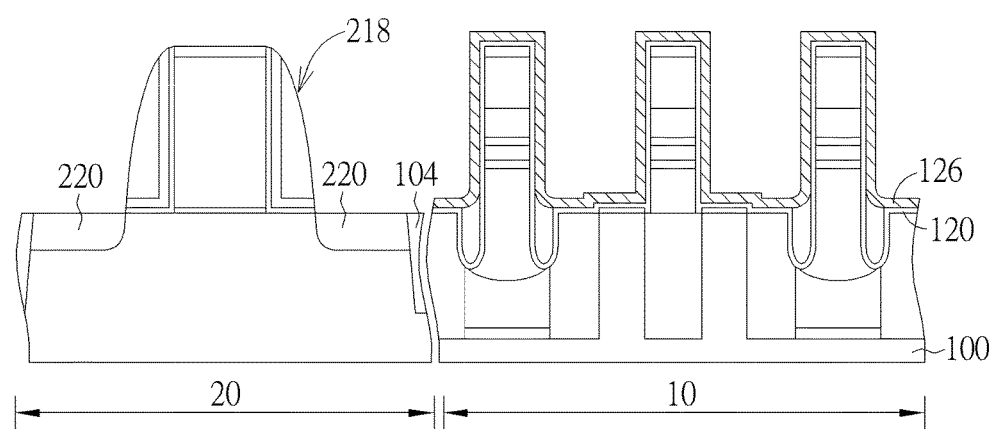

Please refer to FIG. 4. After the second spacer 122 is removed, a first low-K dielectric layer 126 is formed conformally on the memory region 10 and completely covers the bit lines 110. The example of low-K material may include, but not limited to, hydrogen silsesquioxane (HSQ), methyl-silsesquioxane (MSQ), polyphenylene oligomer, methyl doped silica, organo-silicate glass, or porous silicide, etc. Please note that the first low-K dielectric layer 126 is not formed on the logic region 20 in this embodiment. On the other hand, an ion implantation process is performed on the logic region 20 to form source/drain 220 between the spacers 218 and outer field oxide region 104 formed in previous processes.

Figure 5:
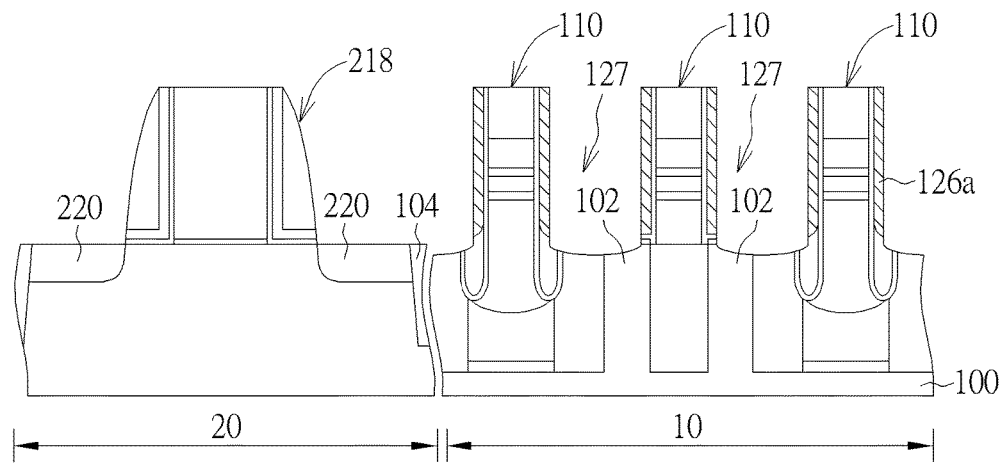

Please refer to FIG. 5. After the first low-K dielectric layer 126 is formed, an anisotropic etch process is performed to remove the first low-K dielectric layer 126 and the first spacer layer 120 on the surface of memory region 10, so that only the first low-K dielectric layer 126 on sidewalls of the bit lines 110 remains and the active regions 102 of memory region 10 are exposed. In this embodiment, storage node regions 127 are defined between bit lines 110 to be preserved for disposing the storage node structures of the memory cells. In the embodiment of the present invention, The approach of forming the first low-K dielectric layer 126a on sidewalls of the bit lines may help to reduce the parasite capacitance induced by close spacing between bit lines and storage node therearound, thereby improving the device's performance.

Figure 6:
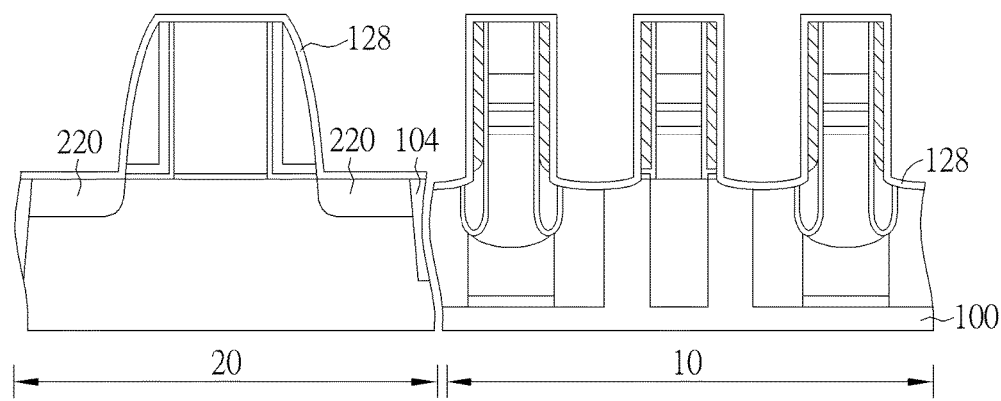

Please refer to FIG. 6. A contact etch stop layer (CESL) 128, such as a silicon nitride layer, is then formed conformally on the memory region 10 and logic region 20. The material of contact etch stop layer 128 has good etch selectivity compared to the material of interlayer dielectric (ILD) to be formed in later process.

Figure 7:
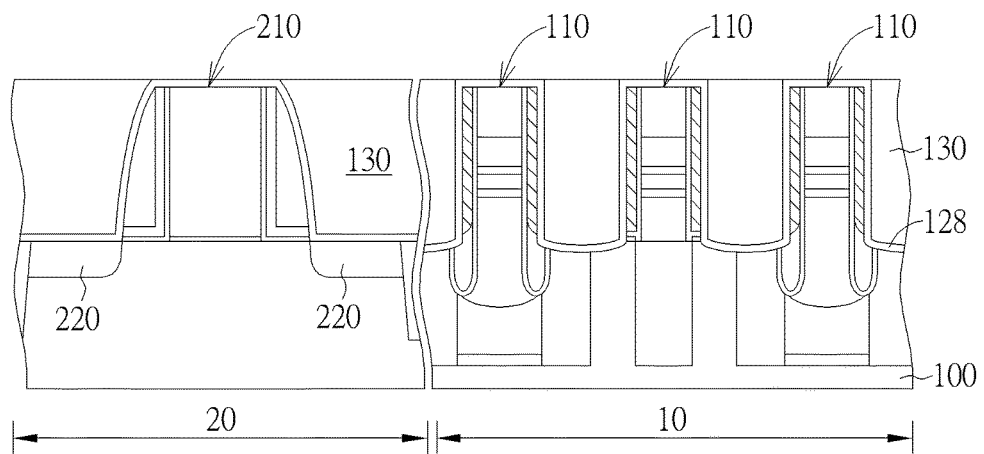

Please refer to FIG. 7. After the contact etch stop layer 128 is formed, an interlayer dielectric 130 is blanket-deposited on the memory region 10 and the logic region 20, and a chemical mechanical polishing (CMP) process is performed to the process surface until the top surfaces of bit lines 110 and logic gates 210 are flush. The interlayer dielectric 130 would fill up the storage node regions 127 between bit line gates 110.

Figure 8:
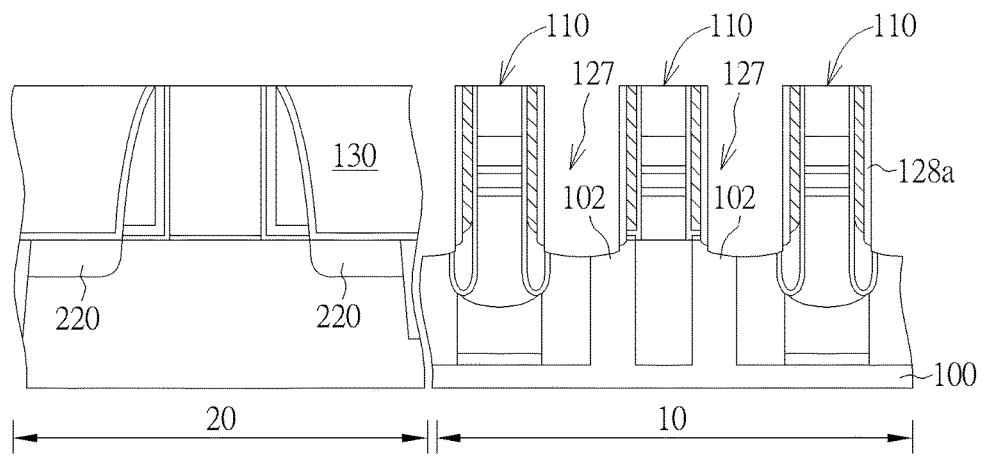

Please refer to FIG. 8. After the interlayer dielectric 130 is formed, the interlayer dielectric 130 in the memory region 10 is removed by using the etchants dedicated for silicon oxide material. An anisotropic etch process is further performed to remove the contact etch stop layer 128 on the surface of memory region 10, so that only the contact etch stop layer 128a on sidewalls of bit lines 110 remains and the active regions 102 in the memory region 10 are exposed. In this way, the storage node regions 127 would be preserved again for the components of storage nodes.

Figure 9:
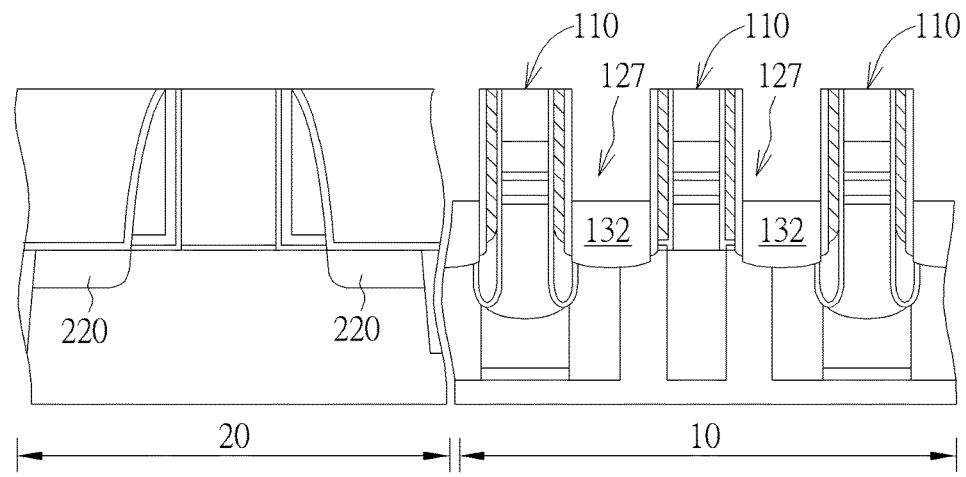

Please refer to FIG. 9. The doped silicon layer 132, such as a phosphorus-doped silicon layer, is then formed in the storage node regions 127 between bit lines 110 in the memory region 10, to function as a lower storage node structure. The top surface of the doped silicon layer 132 would be lower than the top surface of surrounding bit line gates 110, so that the storage node region 127 is not filled up by the doped silicon layer 132. The doped silicon layer 132 may be formed by following processes: first, covering a doped silicon material on the memory region 10. The doped silicon material would fill up the storage node regions 127 between bit lines 110. An etch back process is then performed to remove the doped silicon material outside the storage node regions 127 until the top surface of doped silicon material reaches a predetermined level lower than the top surface of surrounding bit lines 110. The lower storage node structure is therefore completed. The remaining space on the storage node regions 127 may be preserved for the formation of upper storage node structure. Please note that in this embodiment, there is no doped silicon layer formed in the logic region 20.

Figure 10:
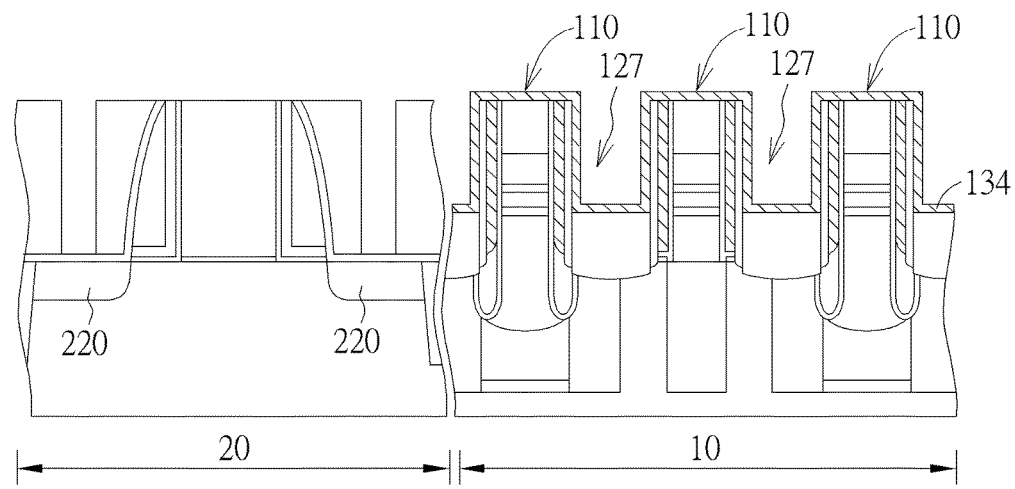

Please refer to FIG. 10. After the doped silicon layer 132 is formed in the storage node regions 127, a second low-K dielectric layer 134 is then conformally formed on the memory region 10. The second low-K dielectric layer 134 covers the surface of bit line gates 110 and remaining storage node regions 127. The material of second low-K dielectric layer 134 may be the same as the one of first low-K dielectric layer 126, which may include, but not limited to, hydrogen silsesquioxane (HSQ), methyl-silsesquioxane (MSQ), polyphenylene oligomer, methyl doped silica, organo-silicate glass, or porous silicide, etc. Please note that in this embodiment, no second low-K dielectric layer 134 is formed on the logic region 20.

Figure 11:
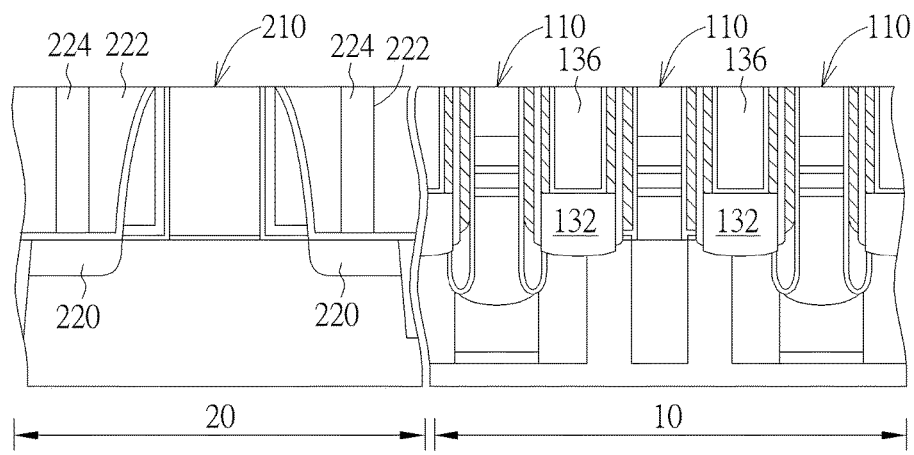

Please refer to FIG. 11. After the second low-K dielectric layer 134 is formed, an etch back process is then performed to remove the second low-K dielectric layer 134 on the top surface of bit lines 110 and on the bottom surface of storage node region 127. Only the portion of second low-K dielectric layer 134a on sidewalls between bit lines remains in the region, so that the doped silicon layers 132 in the storage node regions 127 are exposed. In addition, a photolithographic process and an etch process are further performed on the logic region 20 to form contact holes 222 extending downward to the source/drain 220 below in the interlayer dielectric 130.

Refer again to FIG. 11. The remaining storage node regions 127 in the memory region 20 and the contact holes 222 in the logic region 10 are filled up with metal to form contact plugs 136 and 224 respectively. The contact plugs 136 and 224 may include multilayer structure such as Ti/TiN/W and connect electrically and respectively with the doped silicon layer 132 and the source/drain 220 thereunder. The contact plug 136 on the memory region 20 is connected with the doped silicon layer 132 to function as an upper storage node structure. In addition, a metal silicide process may be performed before the filling process of contact plugs, to form metal silicide layers on exposed surfaces of the doped silicon layer 132 and source/drain 220 and thereby establishing good electrical connection with the contact plugs to be filled in later process.

Figure 12:
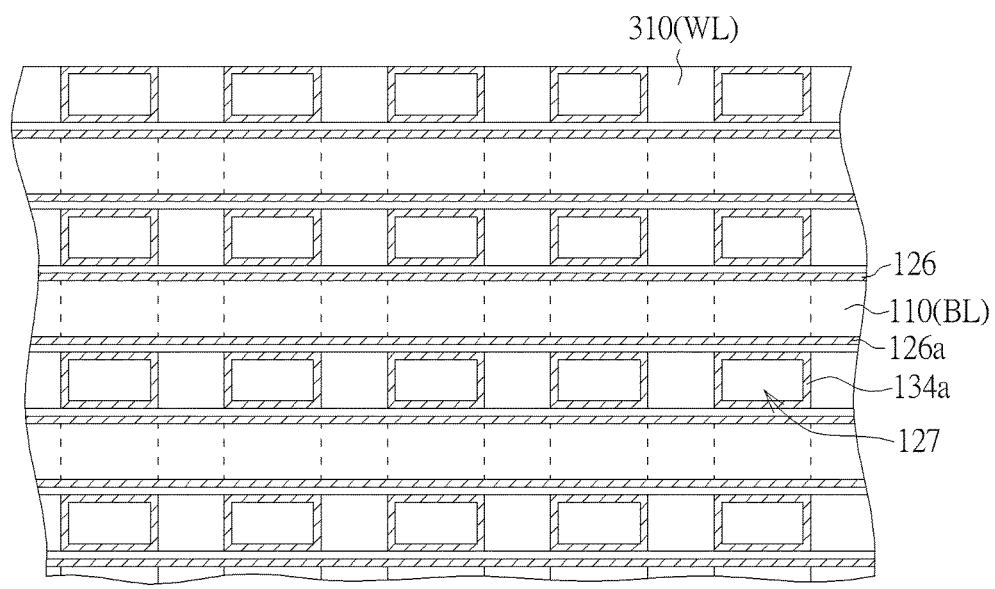
FIG. 12 is a top view of a semiconductor device in accordance with one embodiment of the present invention.

Please refer to FIG. 12, which is a schematic top view of a semiconductor device in accordance with one embodiment of the present invention. In the embodiment of the present invention, the first low-K dielectric layer 126a formed along the sidewalls of bit lines 110 in early step of the process flow may effectively reduce the parasite capacitance induced by close spacing between bit lines and surrounding storage nodes. Furthermore, since the second low-K dielectric layer 134a is formed and disposed on the sidewalls surrounding the storage node regions 127 defined by bit lines 110 (horizontal direction) and the word lines 310 (vertical direction) in late step of the process flow, the entire storage node region may be enclosed by the second low-K dielectric layer 134a, so that the issue of parasite capacitance may be further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing a substrate with memory regions and logic regions;
   forming bit lines and logic gates respectively in said memory region and said logic region, wherein storage node regions are defined between said bit lines;
   forming a first low-K dielectric layer on sidewalls of said bit lines;
   forming a doped silicon layer in each said storage node region between said bit lines, wherein the top surface of said doped silicon layer is lower than the top surface of said bit line;
   forming a second low-K dielectric layer on sidewalls of said storage node regions; and
   filling up said storage node regions in said memory region with contact plugs.

2. The method of manufacturing a semiconductor device of claim 1, further comprising:
   forming a first spacer layer and a second spacer layer on said bit lines and said logic gates;
   forming a third spacer layer on said logic gates after said first spacer layer and said second spacer layer are formed; and
   removing said second spacer layer on said bit lines.

3. The method of manufacturing a semiconductor device of claim 2, wherein the steps of forming said third spacer layer on said logic gates comprises:
   forming said third spacer layer on said memory region and said logic region; and
   performing an etch process to remove said third spacer layer on said memory region.

4. The method of manufacturing a semiconductor device of claim 2, further comprising performing an anisotropic etch process to said first spacer layer, said second spacer layer and said third spacer layer on said logic gates to form spacers on two sides of each said logic gate.

5. The method of manufacturing a semiconductor device of claim 1, wherein the steps of forming said first low-K dielectric layer on sidewalls of said bit lines comprises:
   forming said first low-K dielectric layer on said memory region; and
   performing an etch process to remove said low-K dielectric layer on top surfaces of said bit lines and on the surface of said substrate.

6. The method of manufacturing a semiconductor device of claim 1, further comprising forming a contact etch stop layer on sidewalls of said bit lines and on said logic gates.

7. The method of manufacturing a semiconductor device of claim 6, wherein the steps of forming said contact etch stop layer on sidewalls of said bit lines comprises:
   forming said contact etch stop layer on said bit lines and said logic gates; and
   performing an etch process on said memory region to remove said contact etch stop layer on said top surfaces of said bit lines and on said surface of said substrate.

8. The method of manufacturing a semiconductor device of claim 6, further comprising:
   forming an interlayer dielectric on said contact etch stop layer;

performing an etch process to remove said interlayer dielectric on said memory region and to form contact holes in said interlayer dielectric in said logic region; and filling up said contact holes with said contact plugs.

9. The method of manufacturing a semiconductor device of claim 1, wherein the steps of forming said doped silicon layer in said storage node regions between said bit lines comprises:

forming said doped silicon layer on said memory region; and performing an etch back process to said doped silicon layer until the top surface of said doped silicon layer is lower than the top surfaces of said bit lines.

10. The method of manufacturing a semiconductor device of claim 1, wherein the steps of forming said second low-K dielectric layer on sidewalls of said storage node regions comprises:

forming said second low-K dielectric layer on said bit lines and said doped silicon layer; and performing an etch process to remove said second low-K dielectric layer on the top surfaces of said bit lines and on the top surface of said doped silicon layer, so that said second low-K dielectric layer only remains on sidewalls of said storage node regions.

* * * * *